(12) United States Patent
Li et al.

(10) Patent No.: US 11,170,681 B2
(45) Date of Patent: Nov. 9, 2021

(54) GATE DRIVING CIRCUIT, DRIVING METHOD THEREOF, GATE DRIVER, DISPLAY PANEL AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yan Li, Beijing (CN); Chengfu Xu, Beijing (CN); Lingyun Shi, Beijing (CN); Wei Sun, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 699 days.

(21) Appl. No.: 16/066,749

(22) PCT Filed: Jan. 4, 2018

(86) PCT No.: PCT/CN2018/070785
§ 371 (c)(1),
(2) Date: Jun. 28, 2018

(87) PCT Pub. No.: WO2018/205655
PCT Pub. Date: Nov. 15, 2018

(65) Prior Publication Data
US 2021/0174717 A1 Jun. 10, 2021

(30) Foreign Application Priority Data
May 9, 2017 (CN) .......................... 201710322409.9

(51) Int. Cl.
G06F 3/041 (2006.01)
G09G 3/36 (2006.01)
G09G 3/20 (2006.01)

(52) U.S. Cl.
CPC ............. *G09G 3/20* (2013.01); *G06F 3/0412* (2013.01); *G09G 3/3674* (2013.01); *G09G 2310/0267* (2013.01); *G09G 2310/08* (2013.01)

(58) Field of Classification Search
None
See application file for complete search history.

(56) References Cited

U.S. PATENT DOCUMENTS 9,373,414 B2 6/2016 Shang
9,785,280 B2 * 10/2017 Pang ..................... G06F 3/0412
(Continued)

FOREIGN PATENT DOCUMENTS

CN 103226927 A 7/2013
CN 103226981 A 7/2013
(Continued)

OTHER PUBLICATIONS

Search Report and Written Opinion for International Application No. PCT/CN2018/070785 dated Mar. 30, 2018.
(Continued)

*Primary Examiner* — Dorothy Harris
(74) *Attorney, Agent, or Firm* — Calfee, Halter & Griswold LLP

(57) ABSTRACT

A gate driving circuit, a driving method thereof, a gate driver, a display panel and a display apparatus. In the gate driving circuit, a pull-up sub-circuit is configured to control the potential of a pull-up node according to signals inputted from first, second, third, fourth and fifth signal terminals and the potential of a pull-down node; a reset sub-circuit is (Continued)

configured to reset the potential of the pull-up node according to a signal inputted from a reset terminal; a pull-down sub-circuit is configured to control the potential of the pull-down node according to a signal inputted from the fourth signal terminal, a signal outputted from an output terminal and the potential of the pull-up node; and an output sub-circuit is configured to control a signal outputted from the output terminal according to a signal inputted from the third signal terminal, the potential of the pull-down node and the potential of the pull-up node.

17 Claims, 5 Drawing Sheets

(56) References Cited

U.S. PATENT DOCUMENTS 10,593,416 B2 *  3/2020  Tao .................. G09G 3/3674
2005/0275614 A1 * 12/2005 Kim .................. G11C 19/184
                                                              345/100
2008/0001904 A1 *  1/2008 Kim .................. G09G 3/3677
                                                              345/100
2016/0268004 A1    9/2016  Li et al.
2016/0372063 A1   12/2016  Li et al.
2018/0197448 A1    7/2018  Zhang

FOREIGN PATENT DOCUMENTS

| CN | 104485086 A | 4/2015 |
| CN | 105810251 A | 7/2016 |
| CN | 107134245 A | 9/2017 |

OTHER PUBLICATIONS

First Office Action for Chinese Patent Application No. 201710322409.9 dated May 17, 2018.

* cited by examiner

US 11,170,681 B2

GATE DRIVING CIRCUIT, DRIVING METHOD THEREOF, GATE DRIVER, DISPLAY PANEL AND DISPLAY APPARATUS

CROSS REFERENCE TO RELATED APPLICATIONS

The present application is the U.S. national phase entry of PCT/CN2018/070785 filed on Jan. 4, 2018, which claims the priority of the Chinese patent application No. 201710322409.9 filed on May 9, 2017, the entire disclosures of which are incorporated herein by reference.

TECHNICAL FIELD

The present disclosure relates to the field of display technology, and in particular, to a gate driving circuit, a driving method thereof, a gate driver, a display panel and a display apparatus.

BACKGROUND

A typical HIC (Hybrid in Cell) touch display panel employs a time-division driving mode. That is, the HIC touch display panel performs display scanning and touch scanning in different periods of a frame respectively. In a conventional touch display panel, what often happens is that the potential of a pull-up node in the Gate Driver on Array (GOA) cannot be normally pulled down to an invalid level, thereby interfering with a gate line signal and leading to abnormal screen display.

SUMMARY

An object of the present disclosure is to provide an improved gate driving circuit, a driving method for the gate driving circuit, a gate driver including the gate driving circuit, a display panel and a display apparatus.

According to an embodiment of the present disclosure, there is provided a gate driving circuit, comprising a first signal terminal, a second signal terminal, a third signal terminal, a fourth signal terminal, a fifth signal terminal, a reset terminal, a first voltage terminal, a second voltage terminal, an output terminal, a pull-up sub-circuit, a reset sub-circuit, a pull-down sub-circuit and an output sub-circuit. The pull-up sub-circuit is connected with the first signal terminal, the second signal terminal, the third signal terminal, the fourth signal terminal, the fifth signal terminal, the first voltage terminal, a pull-down node and a pull-up node PU respectively, and configured to control the potential of the pull-up node according to the signals inputted from the first signal terminal, the second signal terminal, the third signal terminal, the fourth signal terminal and the fifth signal terminal as well as the potential of the pull-down node. The reset sub-circuit is connected with the reset terminal, the second voltage terminal and the pull-up node respectively, and configured to reset the potential of the pull-up node according to the signal inputted from the reset terminal. The pull-down sub-circuit is connected with the fourth signal terminal, the first voltage terminal, the output terminal, the pull-up node and the pull-down node respectively, and configured to control the potential of the pull-down node according to the signal inputted from the fourth signal terminal, the signal outputted from the output terminal and the potential of the pull-up node. The output sub-circuit is connected with the third signal terminal, the first voltage terminal, the output terminal, the pull-up node and the pull-down node respectively, and configured to control the signal outputted from the output terminal according to the signal inputted from the third signal terminal, the potential of the pull-down node and the potential of the pull-up node.

According to some embodiments, the pull-up sub-circuit comprises a first transistor, a fifth transistor, a ninth transistor, a tenth transistor and an eleventh transistor. A control pole of the first transistor is connected with the second signal terminal, a first pole of the first transistor is connected with the first signal terminal, and a second pole of the first transistor is connected with the pull-up node. A control pole of the fifth transistor is connected with the pull-down node, a first pole of the fifth transistor is connected with the first voltage terminal, and a second pole of the fifth transistor is connected with the pull-up node. A control pole of the ninth transistor is connected with the fifth signal terminal, a first pole of the ninth transistor is connected with a second pole of the tenth transistor, and a second pole of the ninth transistor is connected with the first voltage terminal. A control pole of the tenth transistor is connected with the fourth signal terminal, and a first pole of the tenth transistor is connected with a second pole of the eleventh transistor. A control pole of the eleventh transistor is connected with the third signal terminal, and a first pole of the eleventh transistor is connected with the pull-up node.

According to some embodiments, the reset sub-circuit comprises a second transistor. A control pole of the second transistor is connected with the reset terminal, a first pole of the second transistor is connected with the pull-up node, and a second pole of the second transistor is connected with the second voltage terminal.

According to some embodiments, the pull-down sub-circuit comprises a sixth transistor, a seventh transistor, an eighth transistor and a capacitor. A control pole of the sixth transistor is connected with the pull-up node, a first pole of the sixth transistor is connected with the first voltage terminal, and a second pole of the sixth transistor is connected with the pull-down node. A control pole of the seventh transistor is connected with the output terminal, a first pole of the seventh transistor is connected with the pull-down node, and a second pole of the seventh transistor is connected with the first voltage terminal. A control pole of the eighth transistor is connected with the fourth signal terminal, a first pole of the eighth transistor is connected with the fourth signal terminal, and a second pole of the eighth transistor is connected with the pull-down node. A first pole of the capacitor is connected with the pull-up node, and a second pole of the capacitor is connected with the output terminal.

According to some embodiments, the output sub-circuit comprises a third transistor and a fourth transistor. A control pole of the third transistor is connected with the pull-up node, a first pole of the third transistor is connected with the third signal terminal, and a second pole of the third transistor is connected with the output terminal. A control pole of the fourth transistor is connected with the pull-down node, a first pole of the fourth transistor is connected with the output terminal, and a second pole of the fourth transistor is connected with the first voltage terminal.

According to some embodiments, the tenth transistor and the eleventh transistor are P-type transistors, and the first transistor, the second transistor, the third transistor, the fourth transistor, the fifth transistor, the sixth transistor, the seventh transistor, the eighth transistor and the ninth transistor are N-type transistors.

According to some embodiments, the tenth transistor and the eleventh transistor are N-type transistors, and the first transistor, the second transistor, the third transistor, the fourth transistor, the fifth transistor, the sixth transistor, the seventh transistor, the eighth transistor and the ninth transistor are P-type transistors.

According to another embodiment of the present disclosure, there is provided a driving method for any of the above gate driving circuits. The driving method comprises a reset phase, a charging phase, a display phase and a discharging phase. In the reset phase, a valid level is inputted from the reset terminal, an invalid level is inputted from the second voltage terminal, and the invalid level inputted from the second voltage terminal VGL is transferred to the pull-up node. In the charging phase, a valid level is inputted from the second signal terminal, a valid level is inputted from the first signal terminal, and the valid level inputted from the first signal terminal is transferred to the pull-up node. In the display phase, a valid level is inputted from the third signal terminal, and the valid level inputted from the third signal terminal is transferred to the input terminal. In the discharging phase, an invalid level is inputted from the second voltage terminal, a valid level is inputted from the third signal terminal, a valid level is inputted from the fourth signal terminal, a valid level is inputted from the fifth signal terminal, and the invalid level inputted from the second voltage terminal is transferred to the pull-up node.

According to still another embodiment of the present disclosure, there is provided a gate driver comprising a plurality of cascaded gate driving circuits of any kind as described above. For a gate driving circuit at each stage, the first voltage terminal is connected with a first voltage line, the second voltage terminal is connected with a second voltage line, the first signal terminal is connected with a first signal line, the second signal terminal is connected with the output terminal of the gate driving circuit at a previous stage, the third signal terminal is connected with a third signal line, the fourth signal terminal is connected with a fourth signal line, the fifth signal terminal is connected with the pull-up node of the gate driving circuit at a next stage, the reset terminal is connected with the output terminal of the gate driving circuit at the next stage, and the output terminal is connected with the reset terminal of the gate driving circuit at the previous stage and the second signal terminal of the gate driving circuit at the next stage.

According to a further embodiment of the present disclosure, there is provided a display panel comprising a gate driver as described above.

According to a still further embodiment of the present disclosure, there is provided a display apparatus comprising a display panel as described above.

DETAILED DESCRIPTION OF THE EMBODIMENTS

In the following, a gate driving circuit, a driving method thereof, a display panel, and a display apparatus provided by the present disclosure will be described in detail in conjunction with the drawings, such that the person having skills in the art can understand the technical solution of the present disclosure much better.

Figure 1:
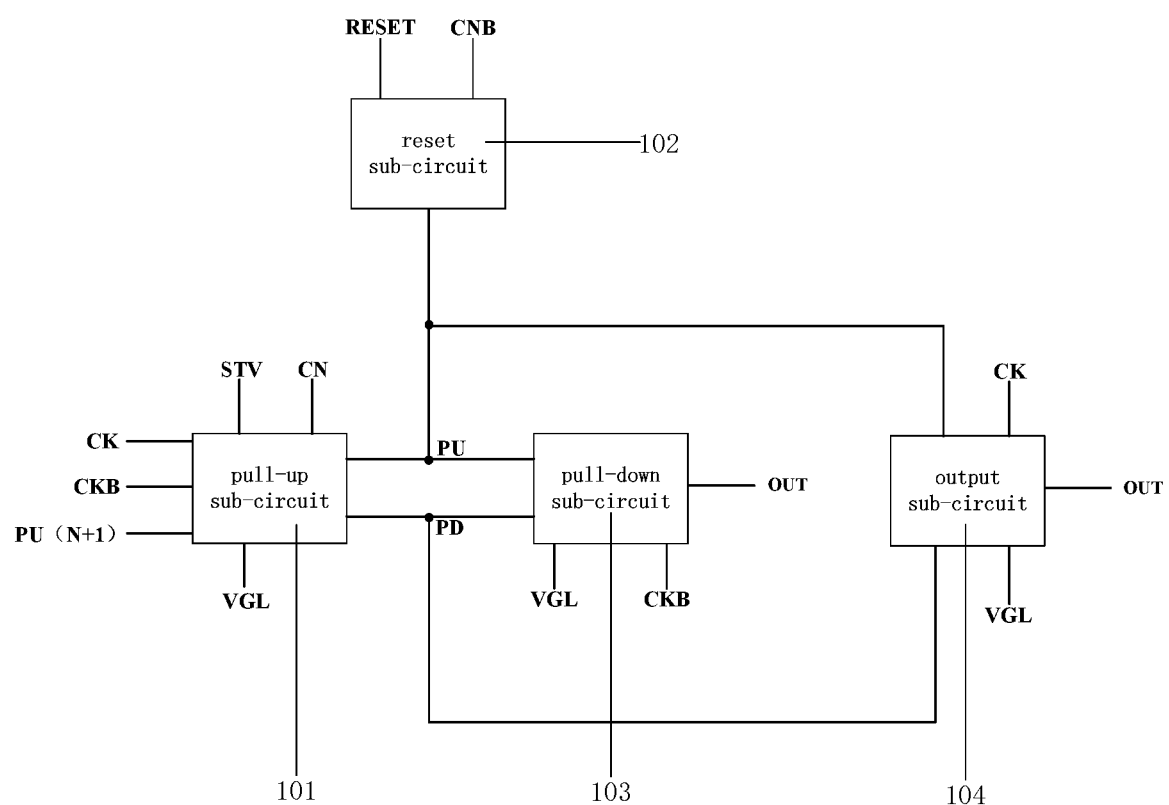
FIG. 1 is a structure diagram of a gate driving circuit according to an embodiment of the present disclosure.

FIG. 1 is a structure diagram of a gate driving circuit provided by an embodiment of the present disclosure. As shown in FIG. 1, the gate driving circuit comprises a first signal terminal CN, a second signal terminal STV, a third signal terminal CK, a fourth signal terminal CKB, a fifth signal terminal PU[N+1], a reset terminal RESET, a first voltage terminal VGL, a second voltage terminal CNB, an output terminal OUT, a pull-up sub-circuit 101, a reset sub-circuit 102, a pull-down sub-circuit 103 and an output sub-circuit 104. The pull-up sub-circuit 101 is connected with the first signal terminal CN, the second signal terminal STV, the third signal terminal CK, the fourth signal terminal CKB, the fifth signal terminal PU[N+1], the first voltage terminal VGL, a pull-down node PD and a pull-up node PU respectively, and configured to control the potential of the pull-up node PU according to the signals inputted from the first signal terminal CN, the second signal terminal STV, the third signal terminal CK, the fourth signal terminal CKB and the fifth signal terminal PU[N+1] as well as the potential of the pull-down node PD. The reset sub-circuit 102 is connected with the reset terminal RESET, the second voltage terminal CNB and the pull-up node PU respectively, and configured to reset the potential of the pull-up node PU according to the signal inputted from the reset terminal RESET. The pull-down sub-circuit 103 is connected with the fourth signal terminal CKB, the first voltage terminal VGL, the output terminal OUT, the pull-up node PU and the pull-down node PD respectively, and configured to control the potential of the pull-down node PD according to the signal inputted from the fourth signal terminal CKB, the signal outputted from the output terminal OUT and the potential of the pull-up node PU. The output sub-circuit 104 is connected with the third signal terminal CK, the first voltage terminal VGL, the output terminal OUT, the pull-up node PU and the pull-down node PD respectively, and configured to control the signal outputted from the output terminal OUT according to the signal inputted from the third signal terminal CK, the potential of the pull-down node PD and the potential of the pull-up node PU.

In the above gate driving circuit, the potential of the pull-up node PU may be normally pulled low by the cooperation between the pull-up sub-circuit, the reset sub-circuit, the pull-down sub-circuit and the output sub-circuit, thereby avoiding interference of the gate line signal by other signals, and improving the uniformity and display quality of the display screen.

Figure 2:
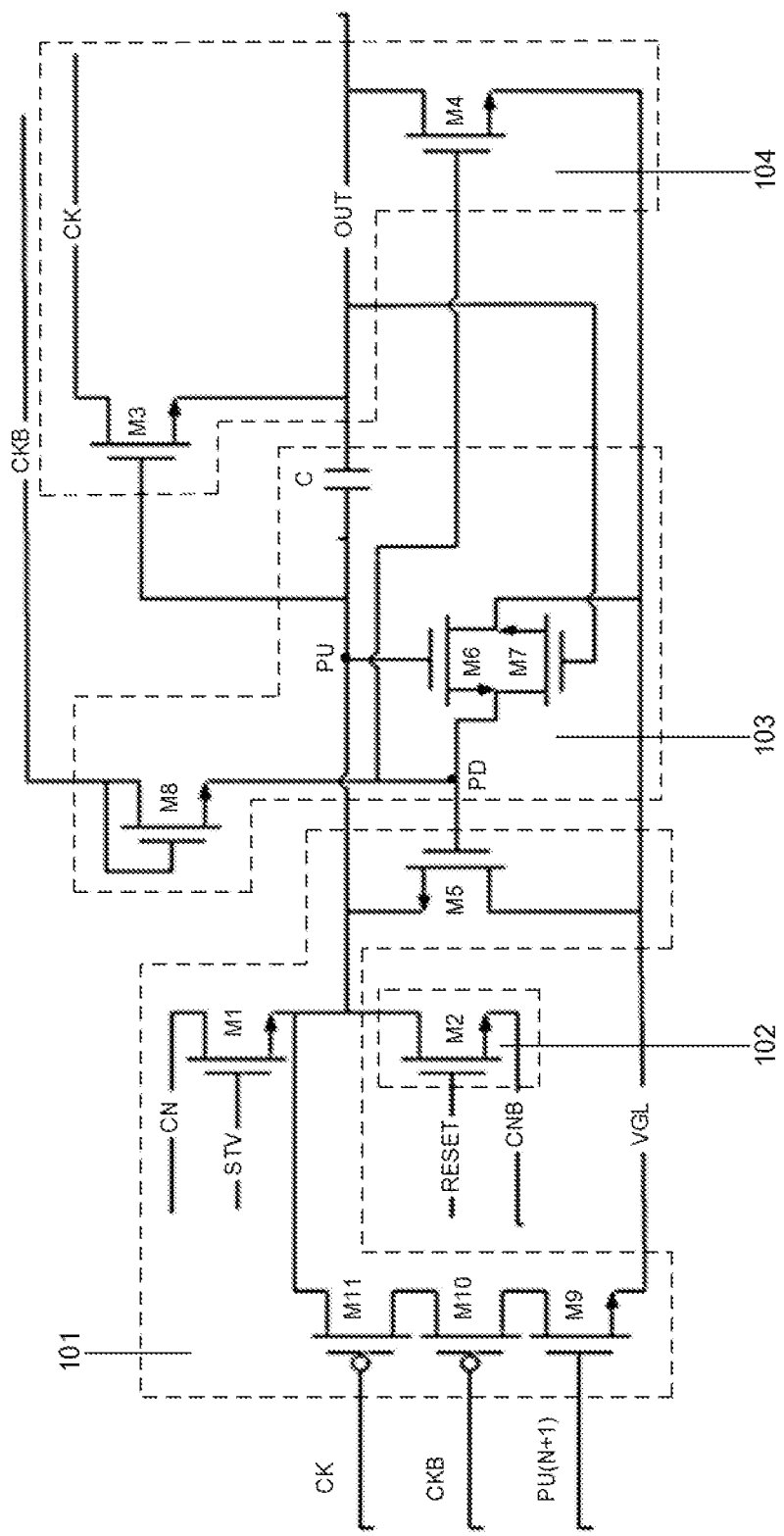
FIG. 2 is a specific structure diagram of the gate driving circuit as shown in FIG. 1 according to an embodiment of the present disclosure.

FIG. 2 is a circuit diagram of the gate driving circuit as shown in FIG. 1 according to an embodiment of the present disclosure. As shown in FIG. 2, the pull-up sub-circuit 101 may include a first transistor M1, a fifth transistor M5, a ninth transistor M9, a tenth transistor M10 and an eleventh transistor M11. A control pole of the first transistor M1 is connected with the second signal terminal STV, a first pole of the first transistor M1 is connected with the first signal terminal CN, and a second pole of the first transistor M1 is connected with the pull-up node PU. A control pole of the fifth transistor M5 is connected with the pull-down node PD, a first pole of the fifth transistor M5 is connected with the first voltage terminal VGL, and a second pole of the fifth transistor M5 is connected with the pull-up node PU. A control pole of the ninth transistor M9 is connected with the fifth signal terminal PU[N+1], a first pole of the ninth transistor M9 is connected with a second pole of the tenth transistor M10, and a second pole of the ninth transistor M9 is connected with the first voltage terminal VGL. A control pole of the tenth transistor M10 is connected with the fourth signal terminal CKB, and a first pole of the tenth transistor M10 is connected with a second pole of the eleventh transistor M11. A control pole of the eleventh transistor M11 is connected with the third signal terminal CK, and a first pole of the eleventh transistor M11 is connected with the pull-up node PU.

In some exemplary embodiments, as shown in FIG. 2, the reset sub-circuit 102 may include a second transistor M2. A control pole of the second transistor M2 is connected with the reset terminal RESET, a first pole of the second transistor M2 is connected with the pull-up node PU, and a second pole of the second transistor M2 is connected with the second voltage terminal CNB.

In some exemplary embodiments, as shown in FIG. 2, the pull-down sub-circuit 103 may include a sixth transistor M6, a seventh transistor M7, an eighth transistor M8 and a capacitor C. A control pole of the sixth transistor M6 is connected with the pull-up node PU, a first pole of the sixth transistor M6 is connected with the first voltage terminal VGL, and a second pole of the sixth transistor M6 is connected with the pull-down node PD. A control pole of the seventh transistor M7 is connected with the output terminal OUT, a first pole of the seventh transistor M7 is connected with the pull-down node PD, and a second pole of the seventh transistor M7 is connected with the first voltage terminal VGL. A control pole and a first pole of the eighth transistor M8 are both connected with the fourth signal terminal CKB, and a second pole of the eighth transistor M8 is connected with the pull-down node PD. A first pole of the capacitor C is connected with the pull-up node PU, and a second pole of the capacitor C is connected with the output terminal OUT.

In some exemplary embodiments, as shown in FIG. 2, the output sub-circuit 104 may include a third transistor M3 and a fourth transistor M4. A control pole of the third transistor M3 is connected with the pull-up node PU, a first pole of the third transistor M3 is connected with the third signal terminal CK, and a second pole of the third transistor M3 is connected with the output terminal OUT. A control pole of the fourth transistor M4 is connected with the pull-down node PD, a first pole of the fourth transistor M4 is connected with the output terminal OUT, and a second pole of the fourth transistor M4 is connected with the first voltage terminal VGL.

In example embodiments, as shown in FIG. 2, the tenth transistor M10 and the eleventh transistor M11 may be P-type transistors, and the first transistor M1, the second transistor M2, the third transistor M3, the fourth transistor M4, the fifth transistor M5, the sixth transistor M6, the seventh transistor M7, the eighth transistor M8 and the ninth transistor M9 may be N-type transistors. Alternatively, in other example embodiments, the tenth transistor M10 and the eleventh transistor M11 may be N-type transistors, and the first transistor M1, the second transistor M2, the third transistor M3, the fourth transistor M4, the fifth transistor M5, the sixth transistor M6, the seventh transistor M7, the eighth transistor M8 and the ninth transistor M9 are P-type transistors.

It should be noted that, the transistors employed in embodiments of the present disclosure may be thin film transistors or field effect tubes or the same devices with other characteristics. Since the source and the drain of a transistor may be exchanged under certain conditions, there is no essential difference between its source and drain in terms of the description of connection relationship. In embodiments of the present disclosure, to differentiate between the source and the drain of a transistor, one of both is called a first pole, the other is called a second pole, and the gate is called the control pole. To distinguish by characteristics, transistors may be divided into N-type and P-type. When employing a P-type transistor, the first pole is the source of the P-type transistor, the second pole is the drain of the P-type transistor, and the P-type transistor is conductive when a low level is inputted to the gate. For an N-type transistor, the situation is the opposite.

Figure 3:
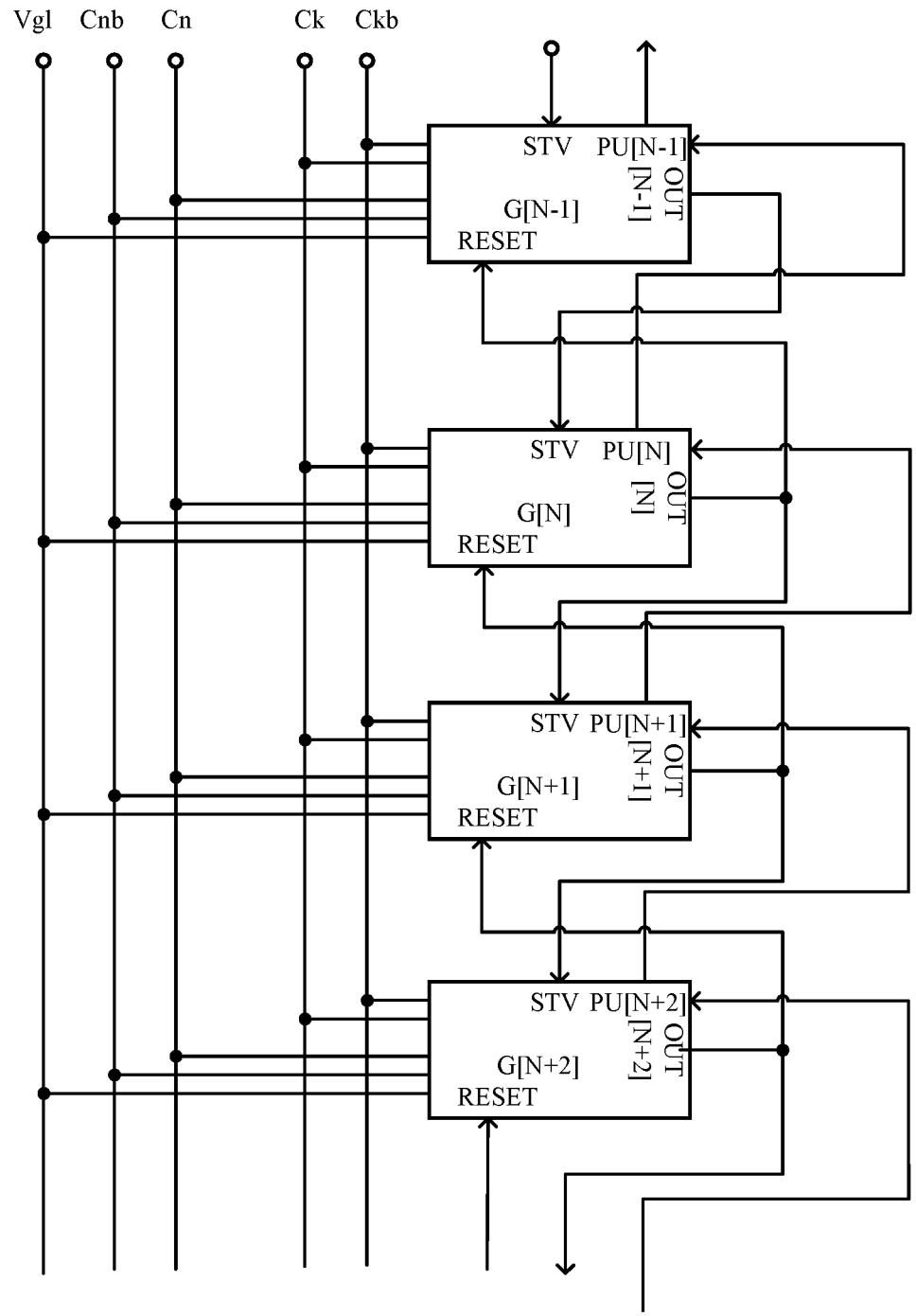
FIG. 3 is a structure diagram of a gate driver according to an embodiment of the present disclosure.

Accordingly, an embodiment of the present disclosure provides a gate driver. As shown in FIG. 3, the gate driver includes a plurality of cascaded gate driving circuits G[N−1], G[N], G[N+1], G[N+2], . . . of any kind as described above. For each gate driving circuit (taking the gate driving circuit G[N] at the N-th stage as an example), the first voltage terminal VGL is connected with a first voltage line Vgl, the second voltage terminal CNB is connected with a second voltage line Cnb, the first signal terminal CN is connected with a first signal line Cn, the second signal terminal STV is connected with the output terminal OUT of the gate driving circuit G[N−1] at a previous stage, the third signal terminal CK is connected with a third signal line Ck, the fourth signal terminal CKB is connected with a fourth signal line Ckb, the fifth signal terminal PU[N+1] is connected with the pull-up node PU of the gate driving circuit G[N+1] at a next stage, the reset terminal RESET is connected with the output terminal OUT of the gate driving circuit G[N+1] at the next stage, and the output terminal OUT is connected with the reset terminal RESET of the gate driving circuit G[N−1] at the previous stage and the second signal terminal STV of the gate driving circuit G[N+1] at the next stage. In the following, a working process of the gate driving circuit as shown in FIG. 2 will be described particularly in conjunction with the time sequence diagram as shown in FIG. 4.

Figure 4:
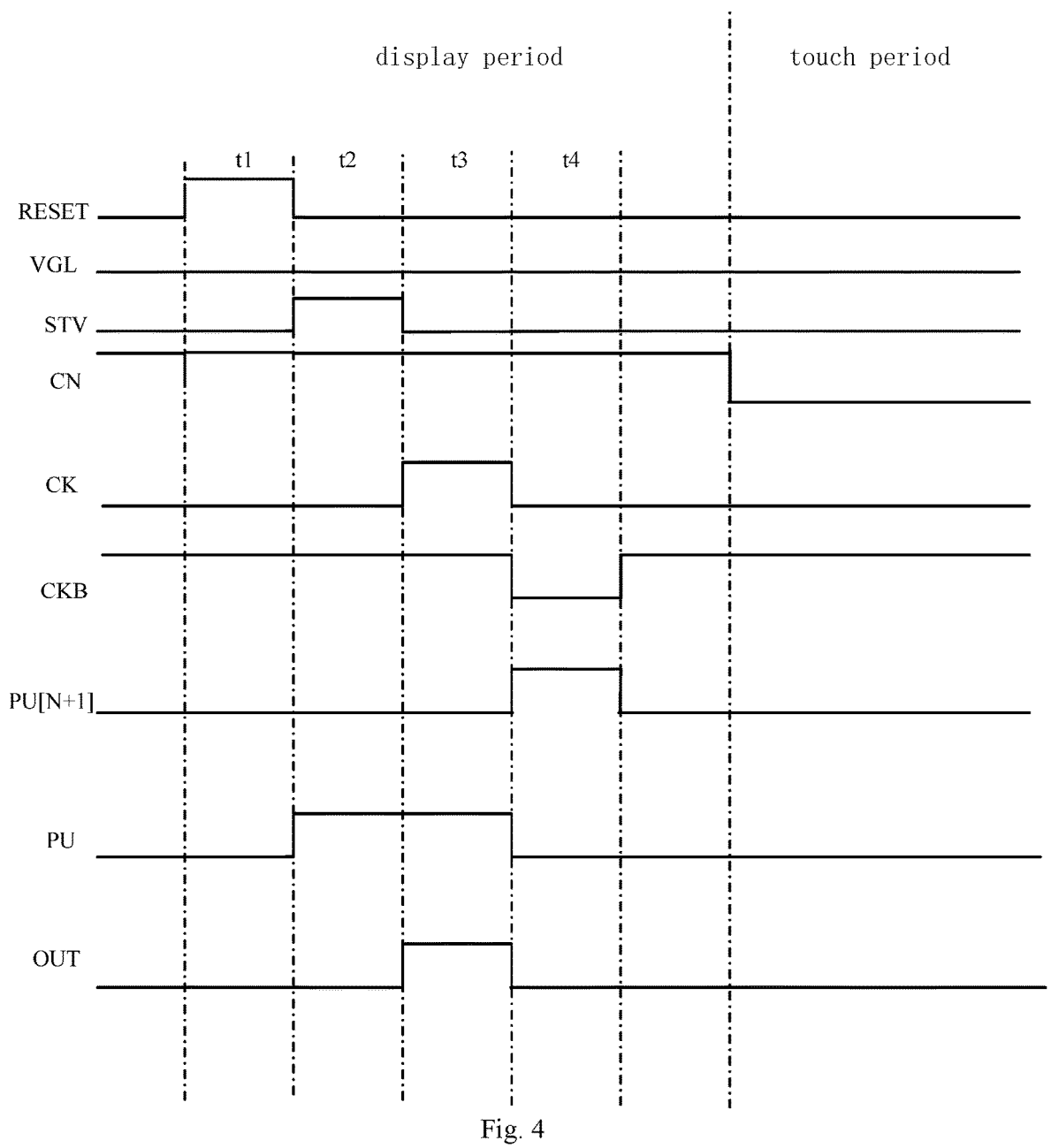
FIG. 4 is a working time sequence diagram of the gate driving circuit as shown in FIG. 2 according to an embodiment of the present disclosure.

As shown in FIG. 4, in a reset phase t1, a valid level is inputted from the reset terminal RESET, and an invalid level is inputted from the second voltage terminal VGL, such that the second transistor M2 is conductive, and thereby the invalid level inputted from the second voltage terminal VGL is transferred to the pull-up node PU. That is, the potential of the pull-up node PU is reset to an invalid level. At this point, the third transistor M3 is turned off, thereby isolating other signals from interfering with the output signal of the gate driving circuit G[N].

In a charging phase t2, a valid level is inputted from the second signal terminal STV, and a valid level is inputted from the first signal terminal CN, such that the first transistor M1 is conductive, and thereby the valid level inputted from the first signal terminal CN is transferred to the pull-up node PU. That is, the potential of the pull-up node PU is pulled up to a valid level. The valid level transferred to the pull-up node PU is stored in the capacitor C.

In a display phase t3, a first valid level is inputted from the third signal terminal CK. Since the capacitor C keeps the potential of the pull-up node PU to be a valid level, the third transistor M3 is conductive, and thereby the valid level inputted from the third signal terminal CK is transferred to the output terminal OUT. That is, the gate driving circuit outputs a valid level.

In a discharging phase t4, an invalid level is inputted from the second voltage terminal VGL, a second valid level is inputted from the third signal terminal CK, a valid level is inputted from the fourth signal terminal CKB, and a valid level is inputted from the fifth signal terminal PU[N+1], such that the eleventh transistor M11, the tenth transistor M10 and the ninth transistor M9 are conductive, and thereby the invalid level inputted from the second voltage terminal VGL is transferred to the pull-up node PU. That is, the potential of the pull-up node PU is pulled down to an invalid level.

As used herein, a "valid level" of an input signal refers to a level which causes an element controlled by the signal to take a corresponding action. For example, in the circuit as shown in FIG. 2, an example is taken in which the tenth transistor M10 and the eleventh transistor M11 are P-type transistors, and the first transistor M1, the second transistor M2, the third transistor M3, the fourth transistor M4, the fifth transistor M5, the sixth transistor M6, the seventh transistor M7, the eighth transistor M8 and the ninth transistor M9 are N-type transistors. In the reset phase, the valid level inputted from the reset terminal RESET is a high level which causes the second transistor M2 to be conductive, and the invalid level inputted from the second voltage terminal VGL is a low level. In the charging phase, the valid level inputted from the second signal terminal STV is a high level which causes the first transistor M1 to be conductive, and the valid level inputted from the first signal terminal CN is a high level. In the display phase, the invalid level inputted from the second voltage terminal VGL is a low level, and the first valid level inputted from the third signal terminal CK is a high level which causes the gate driving circuit to generate an effective output. In the discharging phase, the second valid level inputted from the third signal terminal CK is a low level which causes the eleventh transistor M11 to be conductive, the valid level inputted from the fourth signal terminal CKB is a low level which causes the tenth transistor M10 to be conductive, and the valid level inputted from the fifth signal terminal PU[N+1] is a high level which causes the ninth transistor M9 to be conductive.

In this way, in the gate driver as shown in FIG. 3, by feeding the potential of the pull-up node PU of the gate driving circuit G[N+1] at the next stage back to the gate driving circuit G[N] at the current stage through the fifth signal terminal PU[N+1] of the gate driving circuit G[N] at the current stage during the discharging phase, it may be possible to cause the ninth transistor M9, the tenth transistor M10 and the eleventh transistor M11 of the gate driving circuit G[N] at the current stage to be conductive in the charging phase and the display phase (wherein the potential of the pull-up node PU of the gate driving circuit G[N+1] at the next stage is a valid level) of the gate driving circuit G[N+1] at the next stage, thereby pulling down the potential of the pull-up node PU of the gate driving circuit G[N] at the current stage to an invalid level. Therefore, it is effectively ensured that the pull-up node PU of the gate driving circuit G[N] at the current stage is kept at an invalid level in the charging phase and the display phase of the gate driving circuit G[N+1] at the next stage. Meanwhile, the invalid level of the pull-up node PU causes the third transistor M3 to be turned off, thereby avoiding interference of the output signal from the output terminal OUT by other signals. Thereby, the uniformity of the display screen is guaranteed, and ultimately, the quality of the display screen is improved.

When the gate driving circuit at the current stage is the gate driving circuit at the last stage in the display scanning period, the gate driving circuit at the current stage outputs a touch signal, and the pull-up node PU of the gate driving circuit G[N] at the current stage is still kept at an invalid level in the charging phase and the display phase of the gate driving circuit G[N+1] at the next stage.

Figure 5:
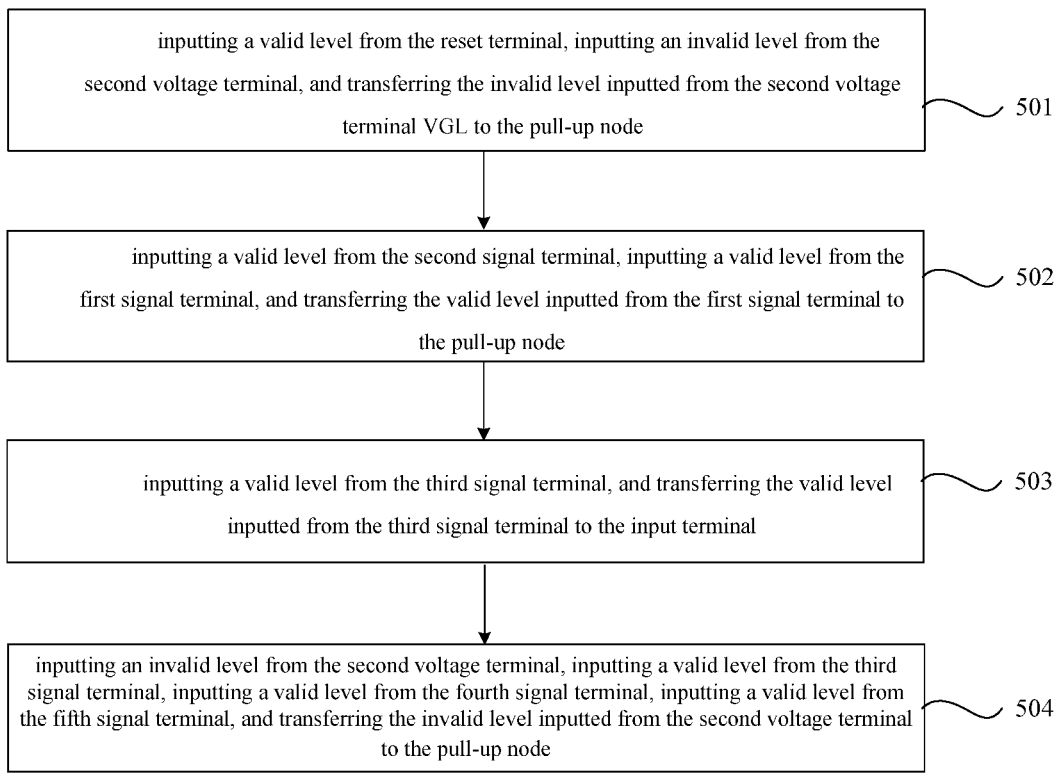
FIG. 5 is a flow chart of a driving method for a gate driving circuit according to an embodiment of the present disclosure.

Accordingly, an embodiment of the present disclosure provides a driving method for a gate driving circuit. As shown in FIG. 5, in a reset phase 501, a valid level is inputted from the reset terminal, an invalid level is inputted from the second voltage terminal, and the invalid level inputted from the second voltage terminal VGL is transferred to the pull-up node.

In a charging phase 502, a valid level is inputted from the second signal terminal, a valid level is inputted from the first signal terminal, and the valid level inputted from the first signal terminal is transferred to the pull-up node.

In a display phase 503, a valid level is inputted from the third signal terminal, and the valid level inputted from the third signal terminal is transferred to the input terminal.

In a discharging phase 504, an invalid level is inputted from the second voltage terminal, a valid level is inputted from the third signal terminal, a valid level is inputted from the fourth signal terminal, a valid level is inputted from the fifth signal terminal, and the invalid level inputted from the second voltage terminal is transferred to the pull-up node.

A further embodiment of the present disclosure provides a display panel comprising a gate driver as described above.

In such a display panel, by pulling down the potential of the pull-up node PU of the gate driving circuit G[N] at the current stage to an invalid level during the charging phase and the display phase of the gate driving circuit G[N+1] at the next stage, it is possible to ensure effectively that the pull-up node PU of the gate driving circuit G[N] at the current stage is kept at the invalid level during the charging phase and the display phase of the gate driving circuit G[N+1] at the next stage. Meanwhile, the invalid level of the pull-up node PU causes the third transistor M3 to be turned off, thereby avoiding interference of the output signal from the output terminal OUT by other signals. Thereby, the uniformity of the display screen is guaranteed, and ultimately, the quality of the display screen is improved.

A further embodiment of the present disclosure provides a display apparatus comprising a display panel as described above.

In such a display apparatus, by pulling down the potential of the pull-up node PU of the gate driving circuit G[N] at the current stage to an invalid level during the charging phase and the display phase of the gate driving circuit G[N+1] at the next stage, it is possible to ensure effectively that the pull-up node PU of the gate driving circuit G[N] at the current stage is kept at the invalid level during the charging phase and the display phase of the gate driving circuit G[N+1] at the next stage. Meanwhile, the invalid level of the pull-up node PU causes the third transistor M3 to be turned off, thereby avoiding interference of the output signal from the output terminal OUT by other signals. Thereby, the uniformity of the display screen is guaranteed, and ultimately, the quality of the display screen is improved.

It may be appreciated that, the above embodiments are exemplary embodiments as employed for the purpose of illustrating the principle of the present disclosure. However, the present disclosure is not limited thereto. For the person having ordinary skills in the art, various variations and improvements may be made without departing from the spirit and essence of the present disclosure, and all these variations and improvements are also construed as falling within the protection scope of the present disclosure.

The invention claimed is:

1. A gate driving circuit, comprising:
   a first signal terminal,
   a second signal terminal,
   a third signal terminal,
   a fourth signal terminal,
   a fifth signal terminal,
   a reset terminal,
   a first voltage terminal,
   a second voltage terminal,
   an output terminal,
   a pull-up sub-circuit,
   a reset sub-circuit,
   a pull-down sub-circuit, and
   an output sub-circuit,
   wherein the pull-up sub-circuit is connected with the first signal terminal, the second signal terminal, the third signal terminal, the fourth signal terminal, the fifth signal terminal, the first voltage terminal, a pull-down node and a pull-up node respectively, and configured to control a potential of the pull-up node according to signals inputted from the first signal terminal, the second signal terminal, the third signal terminal, the fourth signal terminal and the fifth signal terminal as well as a potential of the pull-down node,
   wherein the reset sub-circuit is connected with the reset terminal, the second voltage terminal and the pull-up node respectively, and configured to reset the potential of the pull-up node according to a signal inputted from the reset terminal,
   wherein the pull-down sub-circuit is connected with the fourth signal terminal, the first voltage terminal, the output terminal, the pull-up node and the pull-down node respectively, and configured to control the potential of the pull-down node according to the signal inputted from the fourth signal terminal, a signal outputted from the output terminal and the potential of the pull-up node, and
   wherein the output sub-circuit is connected with the third signal terminal, the first voltage terminal, the output terminal, the pull-up node and the pull-down node respectively, and configured to control the signal outputted from the output terminal according to the signal inputted from the third signal terminal, the potential of the pull-down node and the potential of the pull-up node.

2. The gate driving circuit as claimed in claim 1, wherein the pull-up sub-circuit comprises a first transistor, a fifth transistor, a ninth transistor, a tenth transistor and an eleventh transistor, wherein
   a control pole of the first transistor is connected with the second signal terminal, a first pole of the first transistor is connected with the first signal terminal, and a second pole of the first transistor is connected with the pull-up node;
   a control pole of the fifth transistor is connected with the pull-down node, a first pole of the fifth transistor is connected with the first voltage terminal, and a second pole of the fifth transistor is connected with the pull-up node;
   a control pole of the ninth transistor is connected with the fifth signal terminal, a first pole of the ninth transistor is connected with a second pole of the tenth transistor, and a second pole of the ninth transistor is connected with the first voltage terminal;
   a control pole of the tenth transistor is connected with the fourth signal terminal, and a first pole of the tenth transistor is connected with a second pole of the eleventh transistor; and
   a control pole of the eleventh transistor is connected with the third signal terminal, and a first pole of the eleventh transistor is connected with the pull-up node.

3. The gate driving circuit as claimed in claim 2, wherein the reset sub-circuit comprises a second transistor, and wherein a control pole of the second transistor is connected with the reset terminal, a first pole of the second transistor is connected with the pull-up node, and a second pole of the second transistor is connected with the second voltage terminal.

4. The gate driving circuit as claimed in claim 3, wherein the pull-down sub-circuit comprises a sixth transistor, a seventh transistor, an eighth transistor and a capacitor, wherein
   a control pole of the sixth transistor is connected with the pull-up node, a first pole of the sixth transistor is connected with the first voltage terminal, and a second pole of the sixth transistor is connected with the pull-down node;
   a control pole of the seventh transistor is connected with the output terminal, a first pole of the seventh transistor is connected with the pull-down node, and a second pole of the seventh transistor is connected with the first voltage terminal;
   a control pole of the eighth transistor is connected with the fourth signal terminal, a first pole of the eighth transistor is connected with the fourth signal terminal, and a second pole of the eighth transistor is connected with the pull-down node; and
   a first pole of the capacitor is connected with the pull-up node, and a second pole of the capacitor is connected with the output terminal.

5. The gate driving circuit as claimed in claim 4, wherein the output sub-circuit comprises a third transistor and a fourth transistor;
   a control pole of the third transistor is connected with the pull-up node, a first pole of the third transistor is connected with the third signal terminal, and a second pole of the third transistor is connected with the output terminal; and
   a control pole of the fourth transistor is connected with the pull-down node, a first pole of the fourth transistor is connected with the output terminal, and a second pole of the fourth transistor is connected with the first voltage terminal.

6. The gate driving circuit as claimed in claim 5, wherein the tenth transistor and the eleventh transistor are P-type transistors, and the first transistor, the second transistor, the third transistor, the fourth transistor, the fifth transistor, the sixth transistor, the seventh transistor, the eighth transistor and the ninth transistor are N-type transistors.

7. The gate driving circuit as claimed in claim 5, wherein the tenth transistor and the eleventh transistor are N-type transistors, and the first transistor, the second transistor, the third transistor, the fourth transistor, the fifth transistor, the sixth transistor, the seventh transistor, the eighth transistor and the ninth transistor are P-type transistors.

8. A driving method for a gate driving circuit as claimed in claim 1, comprising a reset phase, a charging phase, a display phase and a discharging phase, wherein
   in the reset phase, a valid level is inputted from the reset terminal, an invalid level is inputted from the second voltage terminal, and the invalid level inputted from the second voltage terminal is transferred to the pull-up node;

in the charging phase, a valid level is inputted from the second signal terminal, a valid level is inputted from the first signal terminal, and the valid level inputted from the first signal terminal is transferred to the pull-up node;

in the display phase, a valid level is inputted from the third signal terminal, and the valid level inputted from the third signal terminal is transferred to the input terminal; and in the discharging phase, an invalid level is inputted from the second voltage terminal, a valid level is inputted from the third signal terminal, a valid level is inputted from the fourth signal terminal, a valid level is inputted from the fifth signal terminal, and the invalid level inputted from the second voltage terminal is transferred to the pull-up node.

9. A gate driver comprising a plurality of cascaded gate driving circuits each as claimed in claim 1, wherein for a gate driving circuit at each stage, the first voltage terminal is connected with a first voltage line, the second voltage terminal is connected with a second voltage line, the first signal terminal is connected with a first signal line, the second signal terminal is connected with the output terminal of the gate driving circuit at a previous stage, the third signal terminal is connected with a third signal line, the fourth signal terminal is connected with a fourth signal line, the fifth signal terminal is connected with the pull-up node of the gate driving circuit at a next stage, the reset terminal is connected with the output terminal of the gate driving circuit at the next stage, and the output terminal is connected with the reset terminal of the gate driving circuit at the previous stage and the second signal terminal of the gate driving circuit at the next stage.

10. A display panel comprising a gate driver as claimed in claim 9.

11. A display apparatus comprising a display panel as claimed in claim 10.

12. The gate driver as claimed in claim 9, wherein the pull-up sub-circuit comprises a first transistor, a fifth transistor, a ninth transistor, a tenth transistor and an eleventh transistor, wherein a control pole of the first transistor is connected with the second signal terminal, a first pole of the first transistor is connected with the first signal terminal, and a second pole of the first transistor is connected with the pull-up node;

a control pole of the fifth transistor is connected with the pull-down node, a first pole of the fifth transistor is connected with the first voltage terminal, and a second pole of the fifth transistor is connected with the pull-up node;

a control pole of the ninth transistor is connected with the fifth signal terminal, a first pole of the ninth transistor is connected with a second pole of the tenth transistor, and a second pole of the ninth transistor is connected with the first voltage terminal;

a control pole of the tenth transistor is connected with the fourth signal terminal, and a first pole of the tenth transistor is connected with a second pole of the eleventh transistor; and a control pole of the eleventh transistor is connected with the third signal terminal, and a first pole of the eleventh transistor is connected with the pull-up node.

13. The gate driver as claimed in claim 12, wherein the reset sub-circuit comprises a second transistor, wherein a control pole of the second transistor is connected with the reset terminal, a first pole of the second transistor is connected with the pull-up node, and a second pole of the second transistor is connected with the second voltage terminal.

14. The gate driver as claimed in claim 13, wherein the pull-down sub-circuit comprises a sixth transistor, a seventh transistor, an eighth transistor and a capacitor, wherein a control pole of the sixth transistor is connected with the pull-up node, a first pole of the sixth transistor is connected with the first voltage terminal, and a second pole of the sixth transistor is connected with the pull-down node;

a control pole of the seventh transistor is connected with the output terminal, a first pole of the seventh transistor is connected with the pull-down node, and a second pole of the seventh transistor is connected with the first voltage terminal;

a control pole of the eighth transistor is connected with the fourth signal terminal, a first pole of the eighth transistor is connected with the fourth signal terminal, and a second pole of the eighth transistor is connected with the pull-down node; and a first pole of the capacitor is connected with the pull-up node, and a second pole of the capacitor is connected with the output terminal.

15. The gate driver as claimed in claim 14, wherein the output sub-circuit comprises a third transistor and a fourth transistor;

a control pole of the third transistor is connected with the pull-up node, a first pole of the third transistor is connected with the third signal terminal, and a second pole of the third transistor is connected with the output terminal; and a control pole of the fourth transistor is connected with the pull-down node, a first pole of the fourth transistor is connected with the output terminal, and a second pole of the fourth transistor is connected with the first voltage terminal.

16. The gate driver as claimed in claim 15, wherein the tenth transistor and the eleventh transistor are P-type transistors, and the first transistor, the second transistor, the third transistor, the fourth transistor, the fifth transistor, the sixth transistor, the seventh transistor, the eighth transistor and the ninth transistor are N-type transistors.

17. The gate driver as claimed in claim 15, wherein the tenth transistor and the eleventh transistor are N-type transistors, and the first transistor, the second transistor, the third transistor, the fourth transistor, the fifth transistor, the sixth transistor, the seventh transistor, the eighth transistor and the ninth transistor are P-type transistors.

* * * * *